(12) United States Patent
Williams et al.

(10) Patent No.: US 8,434,511 B2
(45) Date of Patent: May 7, 2013

(54) RETRACTABLE AND EXPANDABLE WATER COOLED VALVE GATE USEFUL FOR SEALING A HOT PROCESSING CHAMBER

(75) Inventors: Dick S. Williams, St. Charles, MO (US); William L. Luter, St. Charles, MO (US)

(73) Assignee: GT Advanced CZ LLC, Dover, DE (US)

( * ) Notice: Subject to any disclaimer, the term of this patent is extended or adjusted under 35 U.S.C. 154(b) by 154 days.

(21) Appl. No.: 12/786,204

(22) Filed: May 24, 2010

(65) Prior Publication Data
US 2011/0006240 A1  Jan. 13, 2011

Related U.S. Application Data

(63) Continuation-in-part of application No. 12/499,196, filed on Jul. 8, 2009, now abandoned.

(51) Int. Cl.
*F16K 3/06* (2006.01)
(52) U.S. Cl.
USPC ........... 137/340; 251/167; 251/175; 251/178; 251/187; 251/195
(58) Field of Classification Search ................ 251/175, 251/193, 167, 178, 187, 195, 335.3; 137/340
See application file for complete search history.

(56) References Cited

U.S. PATENT DOCUMENTS

| | | | | |
|---|---|---|---|---|
| 2,705,016 A | * | 3/1955 | Saar .................................. 137/1 |
| 3,207,174 A | * | 9/1965 | Berczynski .............. 137/315.31 |
| 3,343,562 A | * | 9/1967 | Combes .................... 137/315.16 |
| 3,381,702 A | * | 5/1968 | Carr ................................ 137/340 |
| 3,524,467 A | * | 8/1970 | Worley ......................... 137/340 |
| 4,157,169 A | * | 6/1979 | Norman ........................ 251/195 |
| 4,337,789 A | * | 7/1982 | Lonardo ....................... 137/340 |
| 4,381,100 A | * | 4/1983 | Schoenberg .................. 251/368 |
| 5,020,775 A | | 6/1991 | Iwasaki et al. |
| 5,062,445 A | | 11/1991 | Junier |
| 5,087,017 A | * | 2/1992 | Sawa et al. ................... 251/175 |
| 5,356,113 A | * | 10/1994 | Mizuishi et al. ............. 251/167 |
| 5,975,492 A | * | 11/1999 | Brenes ......................... 251/175 |
| 6,089,537 A | | 7/2000 | Olmsted |
| 6,443,183 B1 | | 9/2002 | Roorda |
| 6,561,483 B2 | | 5/2003 | Nakagawa et al. |

(Continued)

OTHER PUBLICATIONS

International Search Report, PCT/US2010/0056192, Jun. 23, 2011.

*Primary Examiner* — John Bastianelli
(74) *Attorney, Agent, or Firm* — Edwards Wildman Palmer LLP; George W. Neumer; Stephen D. LeBarron (57) ABSTRACT

A pendulum gate valve including an expandable gate which pivots when unexpanded to selectively block a vacuum or other pressure-differential passage. The valve includes a valve plate sealing one side of the passage and a ring or barrier plate abutting an opposed side of the passage when the gate member is expanded. A compression spring biases apart the valve plate and ring to close the valve by means of respective two-stage hangers attached thereto, extending along the spring, and having distal ends capturing the spring. Pneumatic pressure applied to a pneumatic cavity formed between the middles of the two-stage hangers and accommodating the spring forces apart the valve plate and ring to open the valve in the blocking position. Thereby if pressure fails, the valve fails to a sealed state. The axially movable valve or barrier plate is advantageously water cooled to allow use with a heated processing chamber.

16 Claims, 8 Drawing Sheets

U.S. PATENT DOCUMENTS

| | | |
|---|---|---|
| 6,561,484 B2 | 5/2003 | Nakagawa et al. |
| 6,854,708 B2 * | 2/2005 | Contin et al. ................. 251/167 |
| 6,966,538 B2 | 11/2005 | Hayashi et al. |
| 7,090,192 B2 | 8/2006 | Weiss |
| 7,270,311 B1 | 9/2007 | Brenes |
| 7,347,406 B2 | 3/2008 | Shigetaka |
| 7,396,001 B2 | 7/2008 | Geiser |
| 2004/0079915 A1 | 4/2004 | Contin et al. |
| 2007/0228314 A1 * | 10/2007 | Geiser ........................... 251/158 |
| 2009/0084997 A1 | 4/2009 | Lee |
| 2009/0127487 A1 * | 5/2009 | Iwabuchi ...................... 251/193 |

* cited by examiner

RETRACTABLE AND EXPANDABLE WATER COOLED VALVE GATE USEFUL FOR SEALING A HOT PROCESSING CHAMBER

RELATED APPLICATION

This application is a continuation in part of Ser. No. 12/499,196, filed Jul. 8, 2009 now abandoned.

FIELD OF THE INVENTION

The invention relates to a pendulum or slider valve having a gate laterally movable into and out of a passageway sealable by the gate. In particular, the invention relates to such valves having gates which move laterally into the passageway in a compressed condition and can expand axially to seal the passage way.

BACKGROUND ART

Many types of processing equipment include a processing chamber operating at reduced pressure or in controlled ambient but require a sealable passageway into the processing chamber to allow a workpiece being processed or a large equipment used in the processing to be transferred at least occasionally between the processing chamber and another chamber or the exterior at a different pressure or ambient. As a result, the passageway needs be open for passage of the substrate or insertion of the equipment but closed during other phases of operation. That is, a large valve is required. Two additional requirements for the valve maybe resistance to high temperatures occurring within the adjacent processing chamber and that the action of the valve creates very few particles which would contaminate the processing chamber.

Two related valve types are often used if the passageway needs to be not only large but approximately circular. In a first type called a pendulum gate valve or swing valve, also simply referred to as a pendulum valve, a gate capable of sealing the passageway rotates about an axis offset from the passageway from a retracted position away from the passageway to an active or blocking position in the passageway at which it blocks the passage of large articles through the passageway. In a second type called a slider or shuttle valve, the gate moves laterally along a generally linear axis between the retracted and blocking positions. In either case, once the gate has reached the blocking position, it may block the passageway but it does not necessarily form a vacuum seal. To complete the sealing of the passageway, the gate needs to move generally along the axis of the passageway to engage a sealing surface surrounding the passageway. When the passageway needs to be unblocked, the gate needs to move away from the sealing surface before it is moved out of the passageway.

Although the invention is not so limited, one application of such valves involves the Czochralski growth of silicon ingots or boules in which a crucible filled or recharged with chunks or pellets of silicon is heated to above the melting point of silicon, approximately 1416° C., so that a melt of liquid silicon exists in the crucible. A small seed of silicon is lowered to the surface of the melt. If monocrystalline silicon is desired, the silicon seed should be monocrystalline and of the desired crystalline orientation. By careful control of temperatures near the silicon melting point, the liquid silicon freezes on the silicon seed and the seed grows into a larger piece of silicon of the same crystalline orientation as that of the seed. The growing silicon piece is slowly withdrawn and the process continues so that the width and axial length of the piece continue to increase. Again by careful control of temperatures and other growth parameters, the lateral size can be restrained to a desired diameter, for example, 200 mm or 300 mm desired for the present generation of silicon wafers. The desired product is a generally cylindrical ingot of monocrystalline silicon of the desired diameter and perhaps 2 m long. As the lower end of the ingot grows, the ingot is slowly drawn upwards into a pull chamber above the crucible. After the desired length of ingot is grown, the ingot is tapered down, separated from the melt, and withdrawn into the pull chamber. At least during the melting and growth of the silicon ingot, the crucible chamber should be maintained in an inactive ambient, for example, of argon, and preferably at a reduced pressure typically in the range of 10 to 50 Torr.

In batch Czochralski growth, the crucible is loaded with silicon chunks sufficient to complete the growth of one ingot. After the one ingot is grown, the crucible is typically cooled and then discarded and a new crucible is used for the next ingot. In batch Czochralski, it is typical to selectively isolate the pull chamber from the crucible chamber during the long heat up of the crucible and its charge and then to quickly lower the seed crystal from the pull chamber. Also, it is desirable to cool the ingot independently of the crucible. Conventionally, the valve between the crucible and pull chambers has been implemented as a flapper valve, which is effective but occupies valuable height in the pull chamber. It is desired to make the pull chamber as long as possible without requiring an excessively high ceiling in the factory.

In recharge Czochralski, after the growth of one ingot, the crucible is recharged with another batch of silicon chunks and the process is repeated for a further ingot. However, the recharge should be performed without significantly cooling the crucible and without disturbing the desired ambient of the crucible chamber. As a result, the new charge of silicon should be introduced through a load lock involving some kind of valved passageway.

In continuous Czochralski, only a limited amount of silicon is melted in the crucible but solid silicon is continuously or at least intermittently added to the crucible during the Czochralski drawing process and is immediately melted to augment the liquid. Additionally, multiple ingots are sequentially grown while the crucible remains filled with substantially the same amount of silicon melt. Clearly, the pull chamber must be valved to allow removal of the last grown ingot and the insertion of a new seed. Also, it is desired that the solid silicon charge contained in a hopper be pressurized to the pressure of the crucible chamber and the amount of the charge be less than the total charge required for the lifetime of the crucible. Therefore, some valving is required to isolate the crucible chamber from the hopper when it is being recharged even if this occurs during removal of a grown ingot. In a variant of continuous Czochralski, the silicon is pre-melted outside the crucible and flowed into the crucible to maintain a constant melt level in the crucible, but valving is still required to recharge the pre-melter with additional solid silicon.

Valves used in these Czochralski processes are subject to the two additional requirements of high temperature and low particulate production. Valves facing the interior of the crucible chamber operate with the gate facing a very hot crucible or crucible furnace but conventional seals such as elastomeric O-rings fail well below the temperature of the melted silicon. Even temporary exposure to hot parts may rapidly degrade the O-ring. Secondly, valves need to generate a minimum of particles which could fall into the crucible and contaminate the silicon ingot being produced. However, most valves involve some sort of sliding motion between two adjacent parts typically composed of stainless steel or other contaminating material.

Many pendulum valves accomplish the axial sealing motion by providing an axial movement to the shaft providing the rotary motion to the gate. However, axial movement of the rotary shaft is considered to generate excessive bending on the rotary shaft and large-area gate to provide the large sealing forces required to seal the gate and also to produce undesired particulates by the mechanical movements next to the passageway.

A valve should also be fail safe, for example, during a power failure or pump failure, that is, not uncontrollably change from its sealed to an unsealed condition or vice versa during the failure.

SUMMARY OF THE INVENTION

A pendulum or shuttle gate valve in which an axially expandable gate while in its compressed state is movable transversely to a vacuum-sealable passageway between a retracted position away from the passageway and a blocking position in the passageway. While in the blocking position, the gate can be expanded in both axial directions to both vacuum seal the passage and to forcibly abut an opposed surface to counteract the sealing force.

A pendulum valve rotates the gate about an axis offset from the passageway. A shuttle valve linearly moves the gate perpendicularly to an axis of the vacuum passageway.

Compression springs are supported to axially bias the valve plate and abutment member in opposed outward directions to close the valve. Positive pneumatic pressure can force the valve plate and ring in opposed inward directions to unseal the valve while the gate is in the blocking position.

In one set of embodiments, the valve plate is configured to face toward the hot side and a sealing O-ring may be placed either in the valve plate or in the flange surrounding the passage way. In this embodiment, the abutment member on the other side may be a ring.

In another embodiment, the valve plate is configured to face away from the hot side and the sealing O-ring may be place in the valve plate and never face the hot side in either the blocking or non-blocking position and while moving between the two positions. In this embodiment, the abutment member is preferably an abutment plate which covers the passageway when the gate is closed to thereby shield the valve plate and its O-ring.

The valve plate or abutment plate may be liquid cooled to thermally protect the interior of the valve. The liquid may be water or other liquid supplied through flexible tubing connecting the axially movable valve plate and liquid passages in the arm moving the pendulum valve gate between its retracted and blocking positions.

DETAILED DESCRIPTION OF THE PREFERRED EMBODIMENTS

Figure 1:
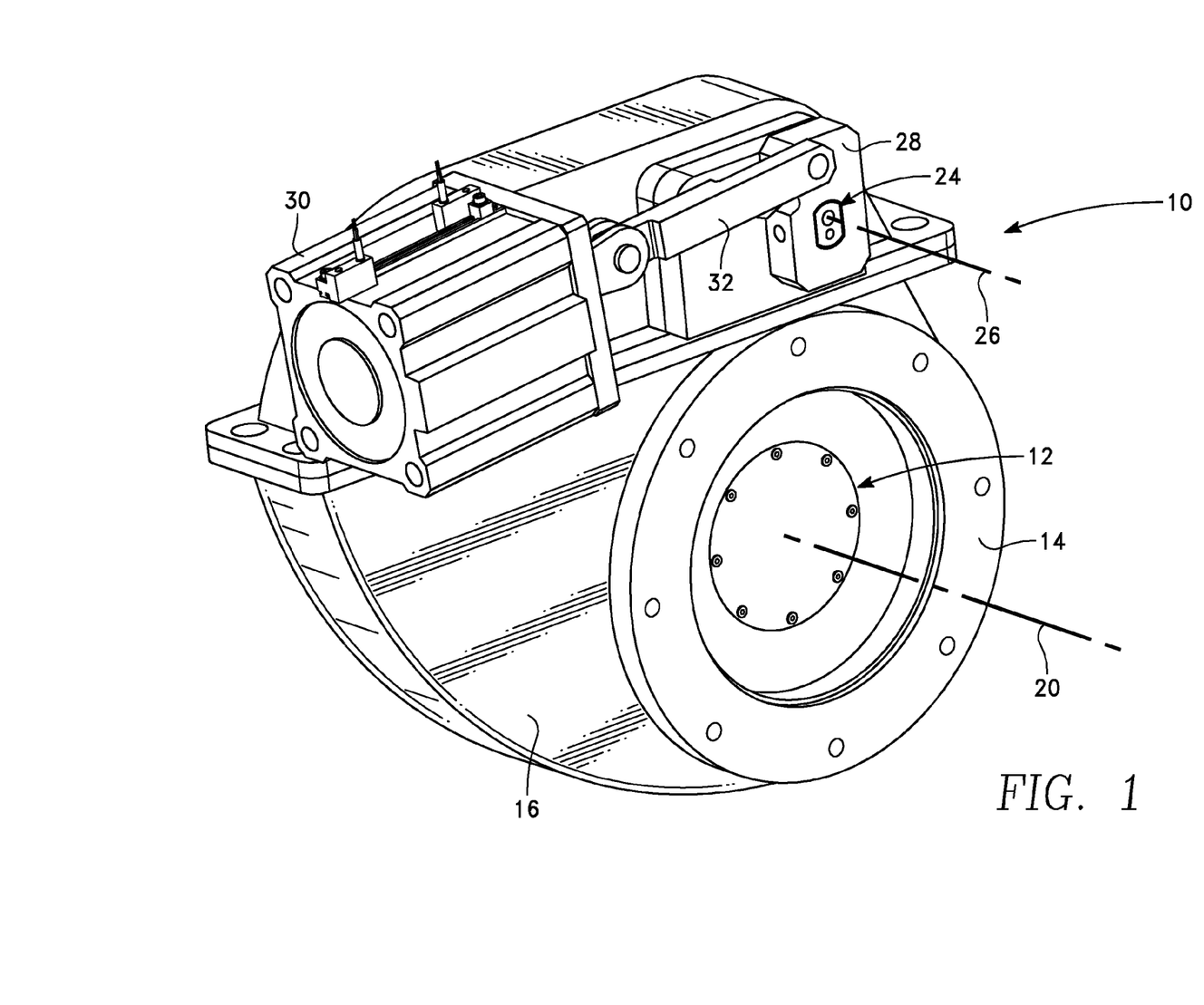
FIG. 1 is an orthographic view of an embodiment of a pendulum gate valve of the invention.
Figure 2:
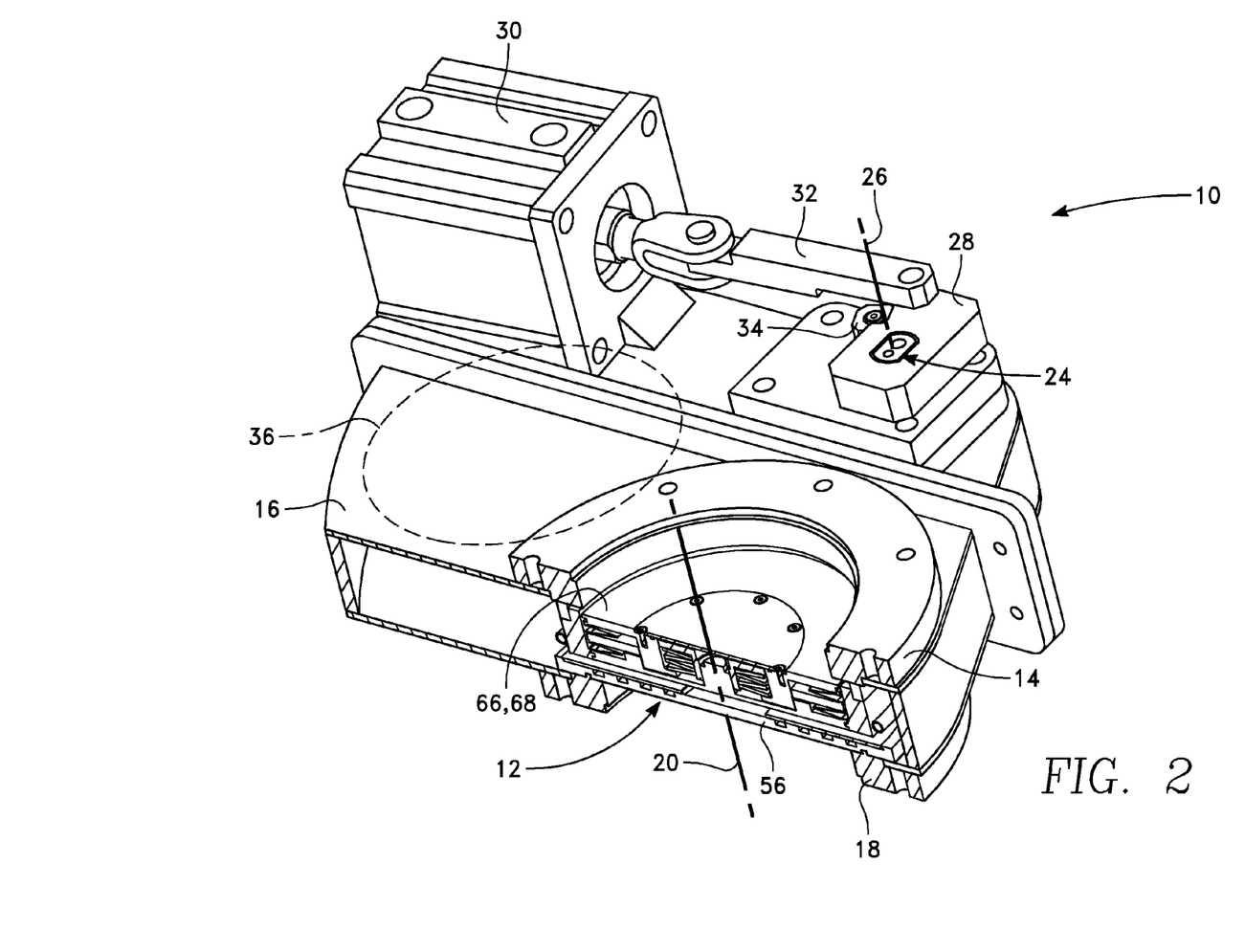
FIG. 2 is an orthographic partially sectioned view of the pendulum gate valve of FIG. 1 taken along another direction.

One embodiment of a pendulum valve 10 of the invention, illustrated in the unsectioned orthographic view of FIG. 1 and a sectioned orthographic view of FIG. 2, includes a gate 12 illustrated in the blocking position adjacent a tapped flange 14 attached to an inner side of a two-piece vacuum-tight valve housing 16. Another tapped flange 18, shown in FIG. 2, is attached to the outer side of the valve housing 16. The flanges 14, 18 may be fixed by bolts and vacuum sealed to respective chambers selectively maintained at different pressures or ambients. The circular bores of the two flanges 14, 18 may be used to define a vacuum port with a passageway extending along a central passage axis 20 and which is selectively sealed by the gate 12. The inner side may be exposed to a hot environment, such as the previously described Czochralski furnace. Nearly all internal parts of the valve 10 except flexible seals maybe constructed of stainless steel.

Figure 3:
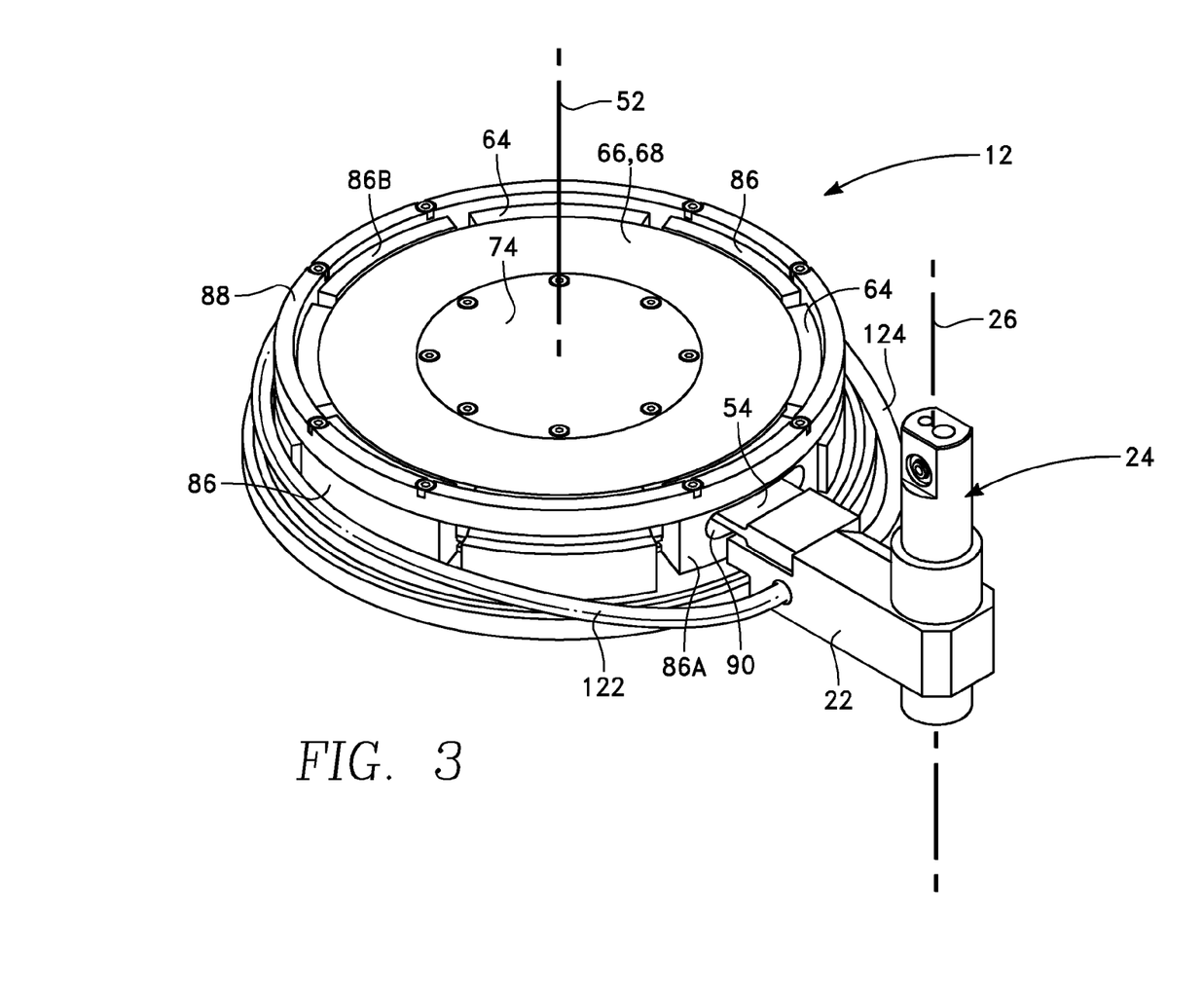
FIG. 3 is an orthographic view of the gate of the pendulum gate valves of FIGS. 1 and 2.
Figure 4:
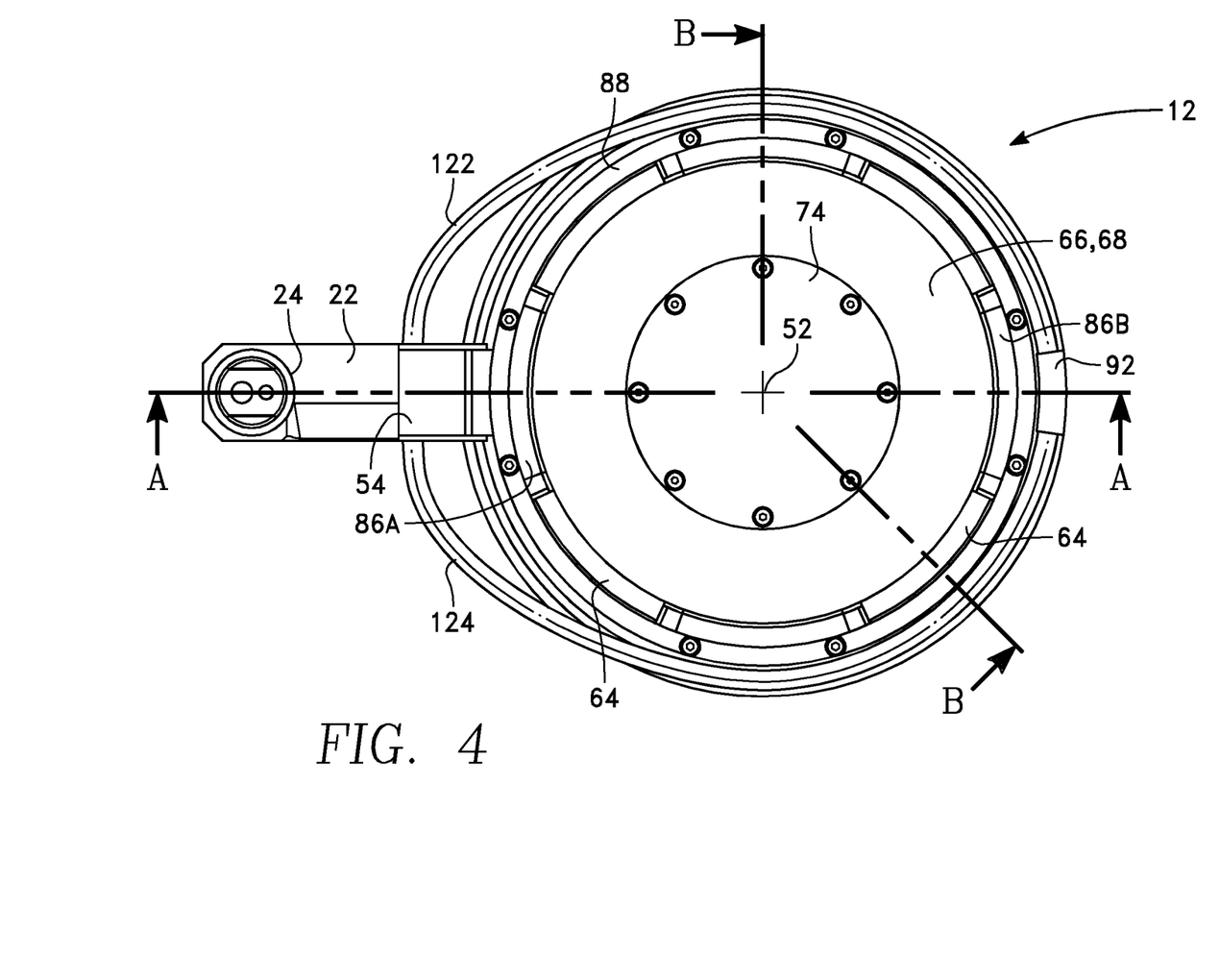
FIG. 4 is a plan view of the gate of FIG. 3.

The gate 12, also illustrated in the orthographic view of FIG. 3 and the plan view of FIG. 4, is supported through a radially extending support arm 22 on a rotary shaft 24 extending along a pivot axis 26 aligned parallel to but offset from the passage axis 20 of the vacuum port and thereby pivots about the pivot axis 26. Returning to FIG. 2, the rotary shaft 24 is fixed externally of the valve housing 16 to a lever arm 28 which extends away from the pivot axis 26 and is connected to an actuator 30 through a double-pivoting link 32 to allow the actuator 26 to move the gate 12 between the illustrated blocking position adjacent the flanges 14, 18 with the lever arm 24 engaging a stop 34 on the housing 16 and an open, retracted or storage position 36, generally indicated by dotted line 36 in FIG. 2. That is, the gate 12 supported by the support arm 22 on the rotary shaft 24 is rotated by the actuator 30 between the retracted position 36 and the blocking position in the passageway as illustrated in FIG. 2. In the retracted position 36, the gate 12 remains within the valve housing 16 but leaves clear the vacuum port for passage of fairly large items the size of the inner diameters of the flanges 14, 18. The retracted position 36 generally underlies the unpatterned portion of the top of the valve housing 16 and under the joint between the two portions of the valve housing 16. The actuator 30 needs to move the gate 12 between only two positions so that a solenoid linear actuator may be used, but pneumatic actuators, motor-drive worm drives, geared drives, or other types of actuators may be substituted. Many of the already described parts are conventional and are commercially available, for example, from GNB Corporation of Elk Grove, Calif.

Figure 5:
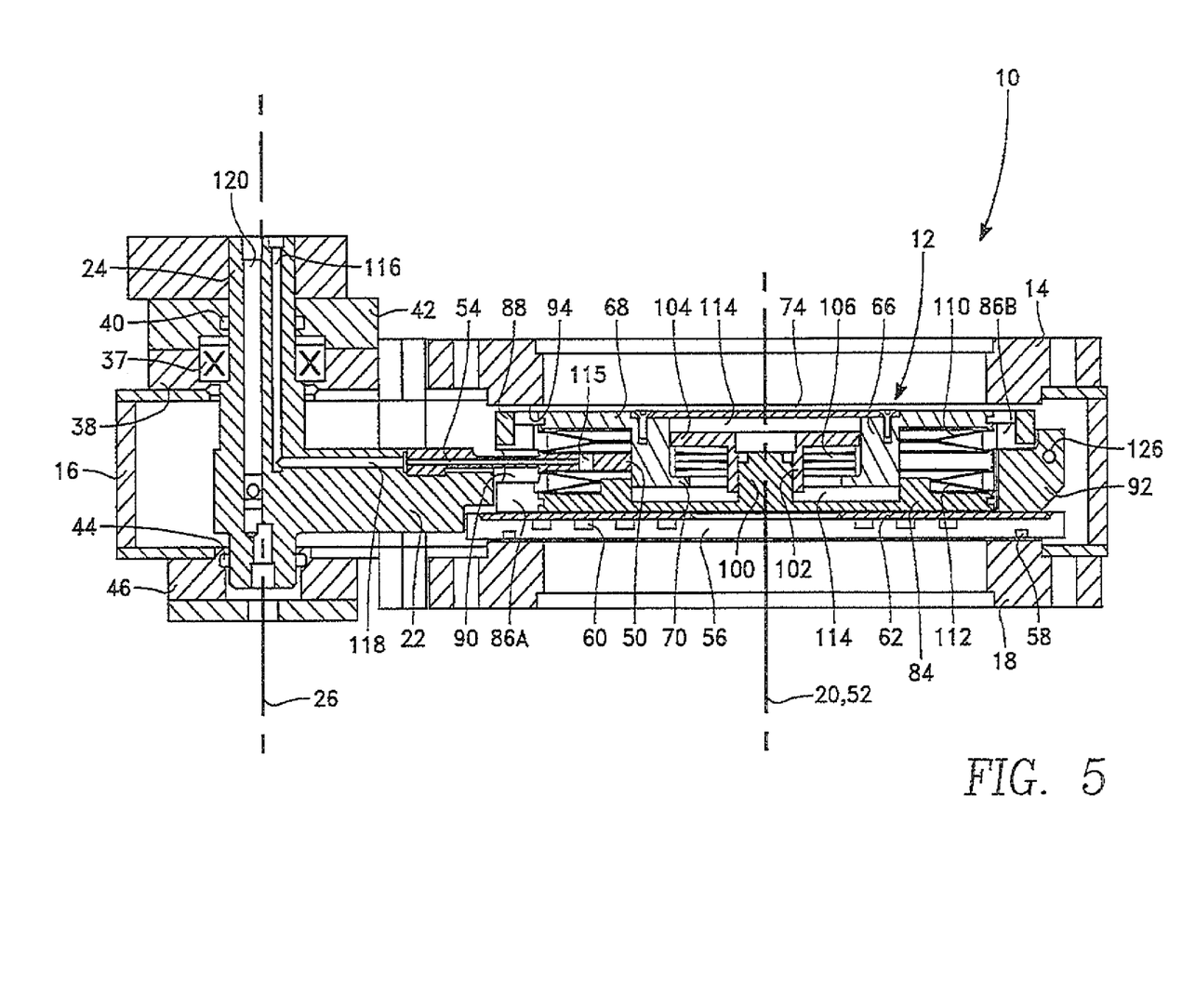
FIG. 5 is a sectioned side view of the pendulum gate valve of FIGS. 1 and 2 including the gate of FIGS. 3 and 4.

The internals of the pendulum valve 10 and its gate 12 are illustrated in more detail in the side cross-sectional view of FIG. 5 taken along section line A-A of the plan view of FIG. 4. Bearings 37 rotatably support the rotary shaft 24 at a fixed axial position in a first mounting plate 38 sealed to the outer side of the valve housing 16. A first rotary seal 40 in a second mounting plate 42 and a second rotary seal 44 in a third mounting plate 46 sealed to the inner side of the valve housing 16 provide a vacuum seal to the rotary shaft 24 between the exterior and interior of the valve housing 16.

The rotary shaft 24 is fixed to the radially extending aim 22 and is integral or, in the illustrated embodiment, fixed to a generally annular middle plate 50 arranged about a gate axis 52, which is generally coincident with the vacuum passage axis 20 when the gate 12 is in the illustrated blocking position. The middle plate 50 includes a handle 54 extending radially outwardly, which is fixed to the support arm 22 and thus to the rotary shaft 24.

The gate 12 is illustrated in FIG. 5 in its blocking but unsealed or contracted position. It includes on its inner (lower as illustrated) side a valve plate 56 having an annular O-ring groove 58 near its outer periphery. A typically elastomeric O-ring placed in the O-ring groove 58 seals the valve plate 56 to a sealing surface at the backside of the inner flange 18 when the gate 12 is axially expanded. A folded spiral cooling channel 60 is formed in the valve plate 56 and is sealed by a generally circular cooling cover 62.

Figure 6:
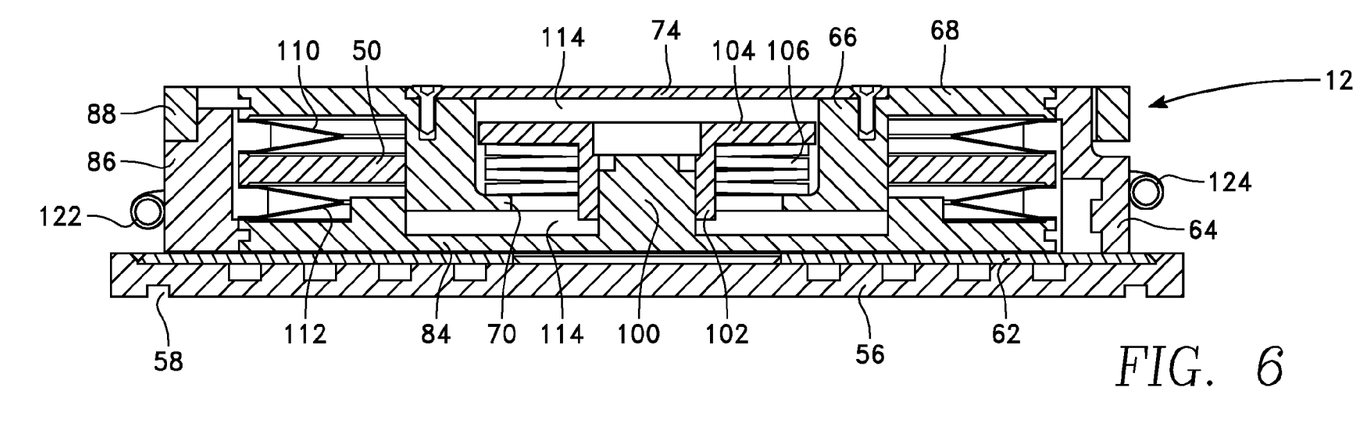
FIG. 6 is a sectioned side view of the gate of FIGS. 3 and 4 in its internally expanded or externally compressed state taken along section line B-B of FIG. 4.
Figure 7:
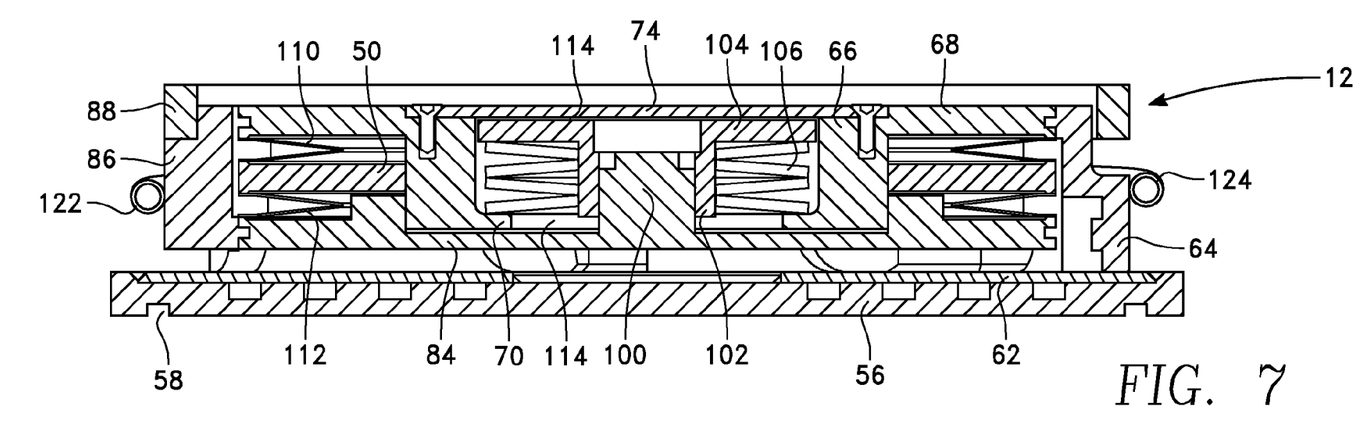
FIG. 7 is a sectioned side view of the gate of FIG. 6 in its internally compressed or externally expanded state taken along the same section line.

The gate 12 is further illustrated in its internally compressed or externally expanded state in the cross-sectional view of FIG. 7 and in its internally expanded or externally compressed state in the cross-sectional view of FIG. 6, both taken along the bent section line B-B of FIG. 4. Three or more (four in the illustrated embodiment) segmented inner risers 64, also called plate links and illustrated in the plan view of FIG. 4, are arranged around the periphery of the cooling cover 62 and attached valve plate 56. The inner risers 64 connect, as best shown in FIGS. 6 and 7, the cooling cover 62 and attached valve plate 56 to an outer plate 66, also called a carrier, located on the other, outer (upwards as illustrated) side of the gate 12. The outer plate 66 has an outer flat-surface flange 68 on its exterior side and an inwardly extending annular rim 70 on its inner side. A circular cap seal 74, which is generally planar with the outer surface of the rim 68, is fixed and vacuum sealed by an O-ring to the outer plate 66 to vacuum seal a central aperture in the outer plate 66. The central aperture forms part of the pneumatic chamber to be described later.

The gate 12 further includes on its inner side a generally circular inner plate 84 attached through three or more (four as illustrated) segmented outer risers 86 to an outer annular abutment ring 88 on the other side of the gate 12. As shown in FIG. 5, the outer riser 86A adjacent the support arm 22 includes a slot 90 to allow the handle 54 of the middle plate 50 to pass through with sufficient axial clearance to accommodate the expansion and compression of the gate 12. The outer riser 86B opposite the support arm 22 similarly includes a lower aperture to accommodate with sufficient axial clearance a generally vertically ascending cooling stem 92 to be fixed to the cooling cover 62 to provide cooling water or other type of chilling liquid to the cooling channels of the valve plate 56, The inner plate 84 is not fixed to the valve plate 58 and a gap between them varies as the gate 12 expands and contracts. Similarly, although the abutment ring 88 and the outer plate 66 are approximately of the same height, they are not fixed together and a relative axial displacement between them varies as the gate 12 expands and contracts. The form and number of the inner and outer risers 64, 86 may be varied. They may be located at different radii and one of them maybe a single tubular element.

As shown in FIGS. 3 and 4, the outer risers 86 are interleaved with the inner risers 64 in a generally circular arrangement about the gate axis 52. In the expanded state of the gate 12 illustrated in FIG. 6, the abutment ring 88 engages an annular abutting surface 94 of the interior side of the outer flange 14 of FIG. 5. In this embodiment, no O-ring is provided at the interior surface of the outer flange 14 and the engagement between the outer flange 14 and the abutment ring 88 chiefly provides an equal and opposite counter-force to the sealing force against the inner flange 18 to thereby reduce or eliminate any torquing or bending of the rotary shaft 24 and support 22 and to allow for sealing forces greater than what the support arm 22 itself could provide. That is, the sealing force is not transmitted through the support arm 22 and the rotary shaft 30 but is exerted generally axially between the flanges 14, 18 and the intermediate abutment ring 88 and valve plate 56. Either or both of the abutment ring 88 and the abutting surface 94 need not be continuous and may be segmented.

The inner plate 84 also includes a center post 100, to which is fixed an inverted annular spring cap 102, for example, by threads between the post 100 and cap 102. The spring cap 102 has an annular rim 104 extending radially outward from the interior side of the post 100.

A compression spring 106 is compressed between the rim 104 of the spring cap 102 connected to the inner plate 84 and the rim 70 of the outer plate 66. The spring cap 102 and middle portions of the outer plate 66 act as respective hangers extending from the inner plate 56 and the outer portions of the outer plate 66 across the space occupied by the spring 106. When the spring 106 is in compression, it presses apart the two rims 70, 104 but inversely pulls together the inner and outer plates 84, 66 and in turn pulls apart the abutment ring 88 and the valve plate 56. That is, the spring 106 biases the gate 12 to its externally expanded or sealed condition. The spring 106 may be formed of Belleville washers, which are conically shaped washers of spring material. When multiple Belleville washers are stacked with alternating conical slopes, they act as a strong compression spring. The spring 106 and associated spring holder 102 may be assembled through the central aperture in the outer plate 66 opened by removing the spring cover or cap, seal 74 and screwing the spring holder 102 onto the post 100 to thereby compress the spring 106 and expand the gate 12 to the point the abutment ring 88 engages the outer flange 14 and the valve plate 56 engages and seals to the inner flange 18 with sufficient force to stand off any anticipated pressure differential across the gate 12. A first annular bellows 110 provides an axially expandable vacuum seal and wall between the middle plate 50 and the outer plate 66 and a second annular bellows 112 similarly provides an axially expandable vacuum seal and wall between the middle plate 50 and the inner plate 84. Thereby, an expandable pneumatic chamber 114 is formed inside the bellows 110, 112, the outer plate 66, and the inner plate 84 including a vertical passage 115 through the middle plate 50 illustrated in FIG. 5. The pneumatic chamber 114 is sealed against both sides of the gate 12 to thus be isolated both from the vacuum chamber and the external side of the vacuum port.

The compression spring 106 is disposed in and axially expands and contracts within the pneumatic chamber 114. The placement of the compression spring 106 within the pneumatic chamber 114 allows the pneumatic chamber 114 to be relatively large in cross section so that the pressure differential applied to the outer and inner plates 66, 84 is applied to areas which are at least 75%, more preferably at least 90% and most preferably 100% of the areas of the central bores of the two flanges 14, 18, which define the amount of force (pressure times area) which must be stood off across the gate 12. Accordingly, the amount of pressure which must be applied to the pneumatic chamber 114 is reduced from the amount of pressure needed if the pneumatic chamber 114 were located within the compression spring 106 and had a much smaller cross section. This relationship is necessitated only by the vacuum sealing side of the gate 12 the involving the outer plate 66 and the bore of the inner flange 18. Such placement also protects the compression spring 106 from the possibly hostile and dirty environments of the two chambers coupled through the gate valve 10.

A selectable source of high pressure air or other gas is connected to the pneumatic chamber 114 through an axial bore 116 in the rotary shaft 24 and a radial bore 118 in the arm 50 and thence through a connected bore in the handle 54 to the vertical passage 115. Positive gas pressure acts against the spring 106 to force apart the inner and outer plates 66, 84 and hence to move the abutment ring 88 and valve plate 56 in opposite directions toward the stationary middle plate 50. That is, positive gas pressure axially compresses the gate 12 to its internally expanded but externally compressed state and opens the valve 10 although the gate 12 may remain in the blocking position in the vacuum port. On the other hand, at reduced pressure, for example, atmospheric pressure from the air source, the compression spring 106 forces apart the two rims 70, 104 and thus inversely pulls together the inner and outer plates 84, 66 and in turn forces apart the valve plate 56 and the abutment ring 88 to the internally compressed but externally expanded or sealed state of the gate 12. It is noted that the mechanical actuation components producing the expansion and compression of the gate 12 are contained within the pneumatic chamber 114 and are isolated from the perhaps hostile process environment and do not contribute contaminants to the process.

The movement between the expanded and compressed states of the gate 12 may be relatively small, for example, 0.110 inch (2.8 mm). Also, as evident from FIG. 5, the axial movement distances of the valve plate 56 and the abutment ring 88 may be different.

It is possible to design a simpler expandable gate in which the spring biases the gate to its closed position and relying upon negative gas pressure to open the valve. However, such a design is limited to a differential pressure of atmospheric pressure and may be inadequate to seal the gate when its outer side is at a lower pressure than its inner side.

The pendulum valve of this embodiment has three normal states, a retracted state in which the gate is positioned away from the vacuum port, a blocking but unsealed state in which the gate is positioned in the passageway of the vacuum port but is not expanded so that it does not seal, and a sealed state in which the gate is positioned in the passageway of the vacuum port and is expanded so as to seal the vacuum port. The first state corresponds to a fully open condition of the valve; the third state to a fully closed condition. Normally, the gate is compressed in the retracted position and during movement between the retracted and blocking positions.

In the case of power outage or loss of pneumatic pressure, a fully closed valve remains fully closed and an opened valve with the gate 12 in the retracted or storage position 36 remains open although the gate 12 will expand at the storage position 36 of the gate 12. Further, if the processing chamber loses vacuum while the outer side of the valve remains at low pressure, the spring force can be of sufficient magnitude to maintain the seal in spite of the reverse pressure differential. That is, the valve 10 can seal in both directions of atmosphere to vacuum and vacuum to atmosphere. As a result, as long as the gate 12 is in the, blocking position, the gate 12 is normally closed (N/C) and fail safe.

Cooling water or other cooling liquid is circulated through the cooling channel 60 formed in the valve plate 56 delivered into and from the valve 10 from flexible hoses through two axial cooling bores 120 formed in the rotary shaft 24 and unillustrated channels in the support arm 22. However, the sealing plate 56 is axially movable over a small distance while the rotary shaft 24 is substantially fixed in the axial direction. As illustrated in FIGS. 3, and 4, flexible metal tubing of, for example, stainless steel form a supply tube 122 and a return tube 124, which are welded or otherwise fixed on two respective ends to the respective channels formed in the support arm 22 and connected to the two cooling bores 120 at the inside of the valve housing 16 and on the other two respective ends to two water ports 126 (see FIG. 5) formed in the cooling stem 92 located opposite the arm 22. Both tubes 122, 124 extend circularly along peripheral paths outside the gate 12 and form respective near semi-circles. The two waters ports 126 in turn are connected through channels in the cooling stem 92 through the cooling cover 62 to opposite ends of the folded spiral cooling channel 60 formed in the valve plate 56. The two ends of the cooling channel 60 are closely adjacent under the cooling stein 92 and the fold of the cooling channel 60 is near the center of the valve plate 56, thereby cooling the valve plate 56 sufficiently to allow the use of fairly conventional O-rings placed in the valve plate O-ring grooves 58 to complete the sealing. The limited axial motion of the valve plate 56 relative to the axially fixed rotary shaft 24 is accommodated by the inherent flexibility of long thin-walled tubes 122, 124.

The valve of the invention can be advantageously used in a Czochralski growth system. A valve of the invention with a generally horizontal passageway may be placed on the side of the crucible chamber to allow a feedstock injector to be introduced into the crucible chamber from a vacuum-pumped feed hopper to replenish silicon source material into the crucible. For recharge Czochralski, the injector may be inserted only between growth cycles to completely fill the crucible for another boule. For continuous Czochralski, the injector remains within the chamber during a growth cycle, but it may need to be removed, without breaking the crucible chamber vacuum, to replenish the hopper or to perform emergency maintenance on the feed system without destroying the crucible.

However, in the configuration of FIG. 5, the elastomeric O-ring placed in the O-ring groove 58 on the chamber side of the valve plate 56 faces the hot side of the crucible and possibly the melt within the crucible when the valve plate 56 is swung into and out of the blocking position. Although the duration of the exposure is short, O-rings, typically made of elastomeric materials, are sensitive to heat and may prematurely degrade. This potential problem is avoided in a gate valve 130, illustrated in the cross-sectional view of FIG. 8, in which an O-ring 132 is instead placed into an annular groove formed in the flange 18 about the central axes 20, 52 on the hot side facing the crucible to seal the valve plate 56 to the flange 18 when the valve gate 12 is expanded. In this configuration, the O-ring 132 itself never faces the hot interior of the furnace chamber. Optionally, the flange 18 may be water-cooled to assure that the O-ring 132 fit in its groove is always maintained at a low temperature.

In all types of Czochralski systems, a large valve of the invention with a vertical passageway may be interposed between the crucible chamber and the pull chamber. During the pulling operating, the gate valve is left opened as the lengthening boule is continuously pulled into the pull chamber above the crucible chamber. Closing the valve allows the crucible chamber and the pull chamber to be isolated before growth commences or to remove a grown boule and replace it with a new seed without venting the crucible to ambient environments in both recharge and continuous Czochralski. Thereby, the pull chamber may be made taller for a given ceiling height.

Figure 8:
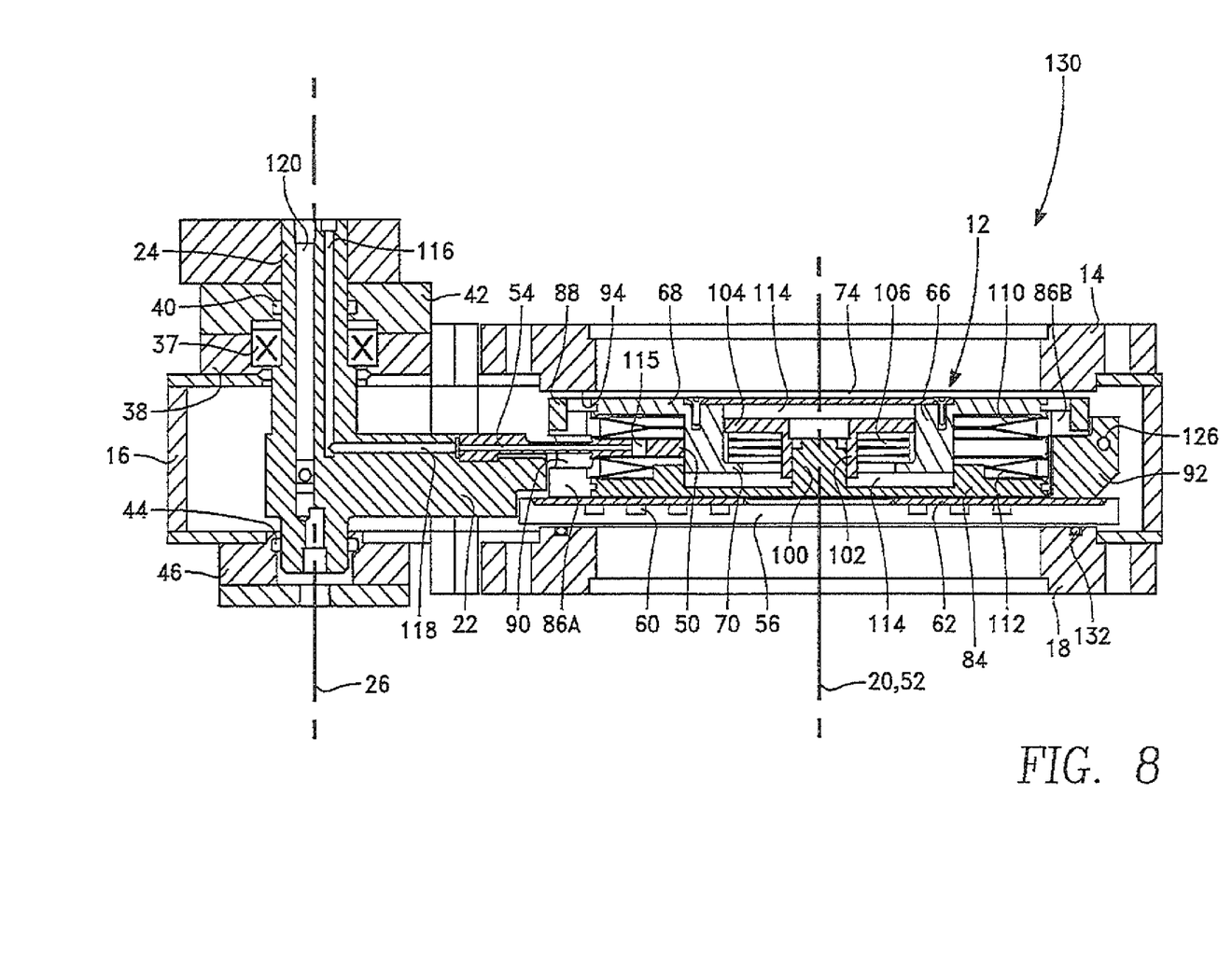
FIG. 8 is a sectioned side view of a pendulum gate valve similar to that of FIG. 5 but with the O-ring placed on the flange of the gate housing.

However, in the configuration of FIG. 5, the O-ring is exposed to the melt within the crucible as the valve gate is moving into or out of the blocking position while in the configuration of FIG. 8 the O-ring is exposed to the hot boule as it is very slowly pulled into the pull chamber although in other applications, such as injecting fresh feedstock into the crucible, the configuration of FIG. 8 may be effective.

Figure 9:
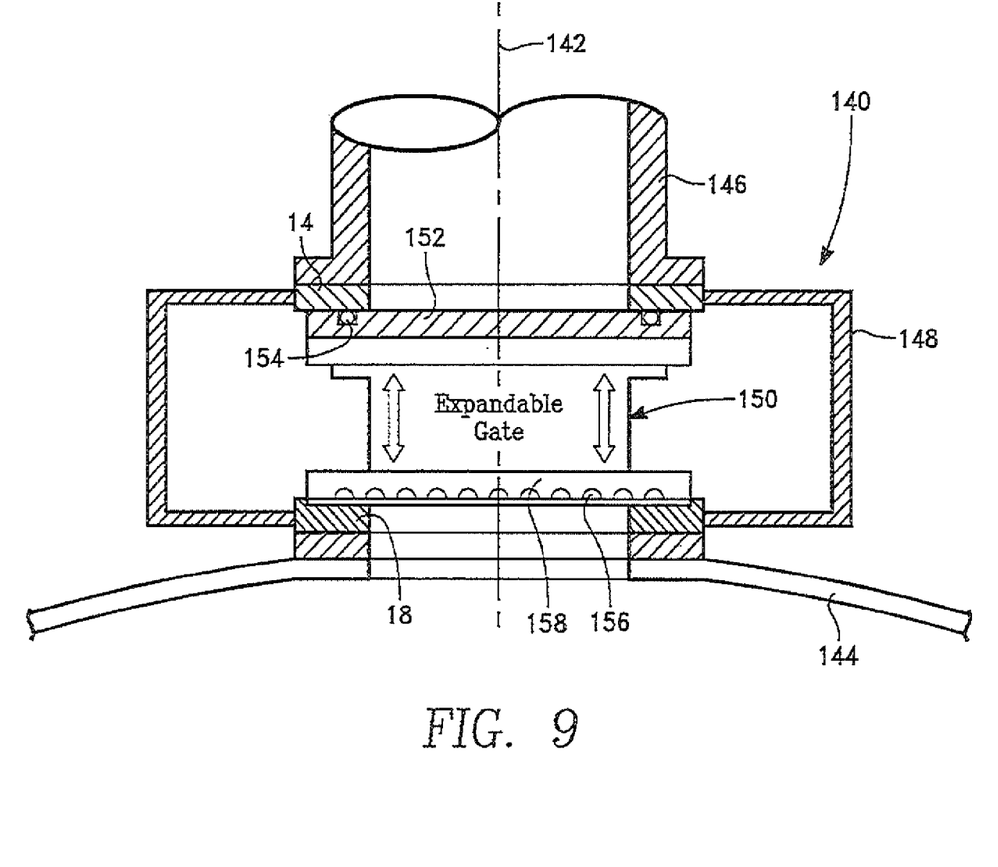
FIG. 9 is a schematic sectioned side view of a pendulum gate valve with the O-ring placed on the side of the gate opposite the processing chamber.

Another embodiment of a gate valve 140 of the invention illustrated in the cross-sectional view of FIG. 9 avoids both these problems. The gate valve 140 is arranged about a vertical central axis 142 between the top of a puller cover 144 over the crucible and a lower end of a pull chamber 146 into which the growing boule is slowly raised from the crucible melt into the pull chamber 146. The gate valve 140 includes a valve housing 148 accommodating a valve gate 150, which can both move into and out of blocking position on the central axis 142 from its storage position 36 of FIG. 2 and can expand and contract along the central axis 142 to seal and unseal the vertical passageway. In this embodiment, a seal plate 152 on the upper side and typically cooler side of the valve gate 150 is continuous and includes a peripheral O-ring groove fitting an O-ring 154 for sealing the seal plate 152 against the exterior flange 14 when the valve gate 150 is expanded. The seal plate 152 performs the sealing function of the valve plate 56 of FIGS. 2-7 but is located on the cool side of the valve.

The valve gate 150 at its bottom side includes a reaction plate 158 to abut against the lower, interior flange 18 when the valve gate 150 is in its expanded state. The reaction plate 158 serves as the abutment member. Unlike the abutment ring 88 of FIGS. 3-8, it is on the hot side of the valve 140 and in the form of a continuous, generally planar plate to act as a barrier plate protecting the interior of valve gate 150 from the hot crucible and its contaminants. A water channel 156 is formed in the reaction plate 158 to water cool it while the reaction plate 158 is facing the crucible. The reaction plate 158 does not need to seal to the interior flange 18 but acts as a thermal barrier for both radiant and convective heat transfer as a barrier for most of the particles generated in the crucible chamber. During the growth cycle, the gate valve 140 is open and the O-ring 158 is disposed within the valve housing 148 at the storage position 36 of FIG. 2 away from the hot portions of the chamber and the growing boule. When the valve gate 150 is swinging into and out of the blocking position, the O-ring 154 does not face the hot crucible but at most faces the grown boule which has separated from the melt and has already substantially cooled. When the valve gate 150 is in its closed position, the interior of the valve housing 148 is generally at the pressure and possibly the ambient of the processing chamber even though the reaction plate 158 acts as a barrier between the two.

The rotation mechanism, the compression and biasing mechanism, and the cooling supply lines for the gate valve 140 may be adapted from the gate valves of FIGS. 1-8.

It is possible to place the O-ring 154 in a groove formed in the upper flange 14 on the cool side of the valve to engage and seal a planar sealing plate 152. However, in the open condition of the valve, the O-ring is then exposed to the hot crucible and to the growing boule passing by it. But, in cooler applications, such a placement would be effective.

The valve of the invention is not limited to Czochralski growth systems and may be used in other applications. Further, although the above description emphasizes the reduced pressures or vacuum of the two chambers connected by the valve 10, the valve 10 may be applied to systems in which one or both of the chambers is subjected to significant positive pressures. In this case for the gate valve of FIG. 5, the strength of the spring 106 and the pressure of the pneumatic source may need to be increased to seal against the positive pressure in front of the valve plate 56.

It is appreciated that the expandable gate of the various embodiments can be easily adapted for use in a shuttle valve in which an expandable gate moves linearly in a direction transverse to the passageway between a retracted position and a blocking position and is expanded in place at the blocking position. That is, the arm 50 of FIGS. 5-8 is reconfigured to linearly move the valve gate 12 into and out of the passageway. Sliders and tracks can be advantageously used.

It is also appreciated that the valve passageway and associated gate and flanges need not be circular but may assume other shapes to accommodate the cross-section of objects being passed through the valve.

The invention thus allows a high-temperature, minimally contaminating gate valve to be formed with few modifications from commercially available valves. Further, the gate valve may be made fail-safe against power, pneumatic, and pump failures.

The invention claimed is:

1. A gate valve comprising:
   a valve housing including a passageway arranged along a passage axis from a first axial side to an opposed second axial side of the valve housing; and
   an expandable gate member movable within the housing from a retracted position displaced from and not blocking the passageway to a blocking position disposed in the passageway, the expandable gate including:
   a sealing member configured to seal a sealing surface disposed on the first axial side when the gate member is expanded,
   an opposed member configured to abut an abutting surface facing the sealing surface and disposed on the second axial side when the gate member is expanded,
   a pneumatic cavity having movable expandable sides disposed inside the gate member such that positive gaseous pressure applied to the pneumatic cavity activates the gate member to a compressed state,
   a compression spring disposed inside the pneumatic cavity and biasing the gate member to an expanded state, and
   first and second flexible side walls forming walls of the pneumatic cavity.

2. The valve of claim 1, wherein the sealing force applied between the sealing member and sealing surface is opposed to the abutting force applied between the opposed member and the abutting surface.

3. The valve of claim 2, wherein both the sealing force and the abutting force are applied by the compression spring.

4. A gate valve comprising:
   a valve housing including a passageway arranged along a passage axis from a first side to an opposed second side of the valve housing;
   a support member movable in a plane perpendicular to the passage axis;
   a valve plate flexibly supported on the support member and configured to move in a first direction along a gate axis parallel to the passage axis to selectively seal to and unseal from a sealing surface on the first side of the valve housing;
   an opposed member flexibly supported on the support member and configured to move in a second direction opposed to the first direction to selectively abut and separate from an abutment surface on the second side of the valve housing;

at least one pneumatic chamber configured to force together the valve plate and the opposed member along the gate axis;

a compression spring disposed in the at least one pneumatic chamber biasing apart the valve plate and the opposed member along the gate axis; and a first flexible side wall connected between the support member and the valve plate and a second flexible side wall connected between the support member and opposed member, the first and second flexible side walls forming walls of the at least one pneumatic chamber.

5. A pendulum gate valve, comprising:

a valve housing including a passageway arranged along a passage axis from a first axial side to an opposed second axial side of the valve housing; and an expandable gate member connected to a rotary shaft extending about along a pivot axis parallel to the passage axis and outside of the passageway and movable from a non-blocking position in the valve housing displaced from and not blocking the passageway and a blocking position disposed in the passageway, comprising a sealing member configured, when the gate member is expanded, to seal a sealing surface disposed on the first axial side, an opposed member configured, when the gate member is expanded, to abut an abutting surface facing the sealing surface, the opposed member disposed on the second axial side, a pneumatic cavity having movable expandable sides disposed inside the gate member such that positive gaseous pressure applied to the pneumatic cavity activates the gate member to a compressed state, at least one cooling channel formed in one of the sealing member or the opposed member, and a compression spring disposed inside the pneumatic cavity and biasing the gate member to an expanded state, and first and second flexible side walls forming walls of the pneumatic cavity.

6. The valve of claim 5, wherein the at least one cooling channel is formed in the sealing member.

7. The valve of claim 5, wherein the opposed member is a barrier plate capable of blocking the passage and the at least one cooling channel is formed in the barrier plate of the opposed member.

8. The valve of claim 5, comprising:

a source of positive pneumatic pressure connected to the pneumatic cavity in the gate member and configured to move the sealing and opposed members to a non-expanded state.

9. The valve of claim 5, further comprising flexible metal tubing disposed within the valve housing and connecting opposite ends of the at least one cooling channel to supply channels formed in the rotary shaft.

10. The valve of claim 5, wherein, the sealing member comprises an outer plate fixed by at least one first riser extending at least partially parallel to the passage axis across an intermediate space to a valve plate, a first rim is fixed to the outer plate and axially extends across the intermediate space, the opposed member comprises an inner plate fixed by at least one second riser extending at least partially parallel to the passage axis across the intermediate space to an abutment ring, a cap comprising a second rim is fixed to the inner plate and axially extends across the intermediate space.

11. A pendulum valve gate for being accommodated in a valve housing having a passageway passing along a passage axis, comprising:

a rotary shaft extending along a pivot axis;

a support arm fixed to the rotary shaft;

an expandable gate member supported on the support arm and movable between a storage position away from the passageway and a blocking position in the passageway and including:

a middle plate fixed to the support arm, a sealing member disposed on one side of the middle plate, and configured to move in a first direction parallel to the pivot axis to seal the sealing member to the valve housing, an opposed member disposed on a second opposed side of the middle plate and including an abutment member configured to move in a second direction opposite the first direction in conjunction with the sealing member, a pneumatic cavity having movable expandable sides disposed inside the gate member such that positive gaseous pressure applied to the pneumatic cavity activates the gate member to a compressed state, a compression spring disposed inside the pneumatic cavity and biasing the sealing member and the opposed member towards each other, and a pneumatic chamber the pneumatic cavity connected to a pressure source, supported on the middle plate, having flexible side walls, axial end wall fixed respectively to the sealing member and the opposed member, and including therein the compression spring.

12. The gate of claim 11, wherein, the sealing member comprises an outer plate fixed by at least one first riser extending at least partially parallel to the passage axis across an intermediate space to a valve plate, a first rim is fixed to the outer plate and axially extends across the intermediate space, the opposed member comprises an inner plate fixed by at least one second riser extending at least partially parallel to the passage axis across the intermediate space to an abutment ring, a cap comprising a second rim is fixed to the inner plate and axially extends across the intermediate space.

13. The gate of claim 12, wherein the pneumatic cavity is formed between the outer and inner plates with expandable walls connecting the outer and inner plates to the middle plate.

14. The gate of claim 11, wherein a cooling channel is formed in the sealing member.

15. The gate of claim 11, wherein the abutment member is formed as a barrier plate configured to block the passageway and includes a cooling channel formed therein.

16. The gate of claim 11, wherein a cooling channel is formed in just the sealing member.

* * * * *